(12) United States Patent
Allen et al.

(10) Patent No.: US 6,429,689 B1
(45) Date of Patent: Aug. 6, 2002

(54) METHOD AND APPARATUS FOR CONTROLLING BOTH ACTIVE AND STANDBY POWER IN DOMINO CIRCUITS

(75) Inventors: David Howard Allen; Daniel Lawrence Stasiak, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/974,395

(22) Filed: Oct. 10, 2001

(51) Int. Cl.$^7$ ............................................. H03K 19/096

(52) U.S. Cl. ............................ 326/95; 326/93; 327/544

(58) Field of Search ............................ 326/93, 95, 98, 326/112, 119, 121, 83; 365/203; 327/544, 225

(56) References Cited

U.S. PATENT DOCUMENTS 5,748,012 A * 5/1998 Beakes et al. ................. 326/93

FOREIGN PATENT DOCUMENTS

JP 03237819 A * 10/1991 .................. 326/95

* cited by examiner

Primary Examiner—Daniel D. Chang
(74) Attorney, Agent, or Firm—Joan Pennington

(57) ABSTRACT

A precharge device is connected to an intermediate precharge node and is arranged to minimize leakage current through the precharge device when deactivated. An input transistor network receiving a plurality of data inputs is connected to the intermediate precharge node. An output inverter is connected to the intermediate precharge node and includes a pair of transistors. A predefined transistor of the pair of transistors is arranged to minimize leakage current through the output inverter. A standby control signal is asserted for a standby mode of the domino circuit and is unasserted for an active mode of the domino circuit. The standby control signal and a clock signal are combined to provide a combined standby clock signal. The combined standby clock signal controls the precharge device. A standby discharge device is connected to the intermediate precharge node and controlled by the standby control signal. The standby discharge device is activated to discharge the intermediate precharge node responsive to the standby control signal being asserted.

20 Claims, 4 Drawing Sheets

000
METHOD AND APPARATUS FOR CONTROLLING BOTH ACTIVE AND STANDBY POWER IN DOMINO CIRCUITS

FIELD OF THE INVENTION

The present invention relates to a method and apparatus for controlling both active and standby power in domino circuits.

DESCRIPTION OF THE RELATED ART

Complementary metal oxide semiconductor (CMOS) compound domino logic (CDL) circuits or domino circuits are known. CMOS domino circuits provide a logical function, such as an OR function or an AND function, providing a logical output signal responsive to a plurality of input signals.

High speed CMOS circuits often employ a domino circuit technique that utilizes pre-charging to improve the gate speeds of the transistors. Many domino circuits include a P-channel field effect transistor (PFET) that is clocked to precharge an intermediate node causing the output to go to a predetermined logic state. Circuit nodes are pre-charged during each clock cycle to a certain level.

While dynamic circuits offer a significant area and performance advantage over other circuit styles, one of their major disadvantages is potentially higher power dissipation when compared to static CMOS circuits. This is because a dynamic circuit relies on the clock to precharge the circuit, and then conditionally discharges depending upon the states of the inputs to the circuit.

FIG. 1 shows the topology of one type of dynamic circuit, an unfooted domino logic gate. As shown in FIG. 1, a precharge PFET device is gated by CLOCK to precharge an intermediate node coupled to an output inverter. A plurality of input signals is applied to an N-channel field effect transistor (NFET) network connected to the intermediate node and the output inverter that provides a logical output signal responsive to the plurality of input signals. A feedback or half-latch device is connected to the intermediate node having a gate input connected to the output of the output inverter. A domino logic gate with a footer includes an additional NFET, gated by CLOCK, between the NFET network and ground.

Like most dynamic circuits, domino gates can switch both high and low up to once per cycle. For example, in a simple dynamic two input wide OR function, the precharge node will be driven to VDD through the precharge device and then, when the clock is low, if either input goes high the precharge node will discharge and the output will go high. This will happen each cycle even if the inputs do not change. As long as either input is high, in the case of an OR gate, when the clock is low, the precharge and output nodes will make a transition. This results in higher power dissipation than, for example, a static CMOS OR gate that does not transition as long as the inputs are stable. In many cases the output of the dynamic circuit is not even required in a particular clock cycle, but it transitions, wasting power, nonetheless.

In addition, since dynamic circuits require a clock to enable their precharge, the clock circuitry must dissipate power each cycle charging and discharging clocked transistors, even if the logic implemented in the dynamic circuit is not required or involved in a particular cycle. For example, a dynamic rotator circuit contains many precharge and evaluate transistors which are connected to the clock distribution network and are switched every cycle, but instructions which use the rotator circuit comprises a tiny fraction of the instruction mix in a typical workload.

Traditional approaches to minimizing this wasteful switching activity include gating clocks so that when the output of the circuit is not required, or can be generated from some other mechanism; the dynamic circuit is placed in standby mode. The intent of standby mode is to limit or eliminate the switching activity that occurs in a dynamic circuit when it is not being used.

Unfortunately, the traditional approaches do nothing to reduce leakage current. Leakage current occurs in transistors that are off. For example, leakage current occurs in an NFET that is off the gate of the NFET is below a threshold voltage (VT) of the NFET. Leakage current is becoming an increasingly large fraction of the total power dissipation in high performance circuits. For example, in a processor designed in a 0.18 $\mu$m silicon-on-insulator (SOI) technology, leakage power typically accounts for approximately 30% of the total power dissipation in product that has been fabricated with short channel lengths. The regions of the substrate that receive dopants on opposite sides of the gate conductor are referred to as junction regions and the distance between junction regions is typically referred to as the physical channel length. After implantation and subsequent diffusion of the junction regions, the distance between the junction regions become less than the physical channel length and is referred to as the effective channel length (LEFF). In high density designs, the physical channel length and the effective channel length (LEFF) are typically short.

Leakage current can be controlled by the use of transistors with longer channel lengths (LEFF) and/or higher threshold voltage (VT) than the minimum that are allowed by a technology. Unfortunately, high VT or long LEFF transistors have less drive and result in slower circuits. Using high VT and long LEFF transistors to control standby or leakage current can be counterproductive since the designer may need to use larger (greater width) transistors to compensate for the reduced performance of the high VT long LEFF devices, the net result of which is a higher active power.

Another approach is to use low leakage header device or footer device that serve to block the path from VDD or ground respectively but these devices tend to place impedance in the critical path of the circuit and require a large area to implement.

A need exists for an effective mechanism for controlling both active and standby power in domino circuits.

SUMMARY OF THE INVENTION

A principal object of the present invention is to provide an improved method and apparatus for controlling both active and standby power in domino circuits. Other important objects of the present invention are to provide such a method and apparatus for controlling both active and standby power in domino circuits substantially without negative effect and that overcome many of the disadvantages of prior art arrangements.

In brief, a method and apparatus are provided for controlling both active and standby power in a domino circuit. A precharge device is connected to an intermediate precharge node and is arranged to minimize leakage current through the precharge device when deactivated. An input transistor network receiving a plurality of data inputs is connected to the intermediate precharge node. An output inverter is connected to the intermediate precharge node and includes a pair of transistors. A predefined transistor of the pair of transistors is arranged to minimize leakage current through the output inverter. A standby control signal is asserted for a standby mode of the domino circuit and is unasserted for an active mode of the domino circuit. The standby control signal and a clock signal are combined to provide a combined standby clock signal. The combined standby clock signal controls the precharge device. The precharge device is deactivated responsive to the standby control signal being asserted. A standby discharge device is connected to the intermediate precharge node and controlled by the standby control signal. The standby discharge device is activated to discharge the intermediate precharge node responsive to the standby control signal being asserted.

In accordance with features of the invention, a field effect transistor having either a predefined higher threshold voltage (VT) or a longer design channel length is used for both the precharge device and the predefined transistor of the pair of transistors to minimize leakage current in the domino circuit. The standby discharge device is a small N-channel field effect transistor (NFET) connected between the intermediate precharge node and ground.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
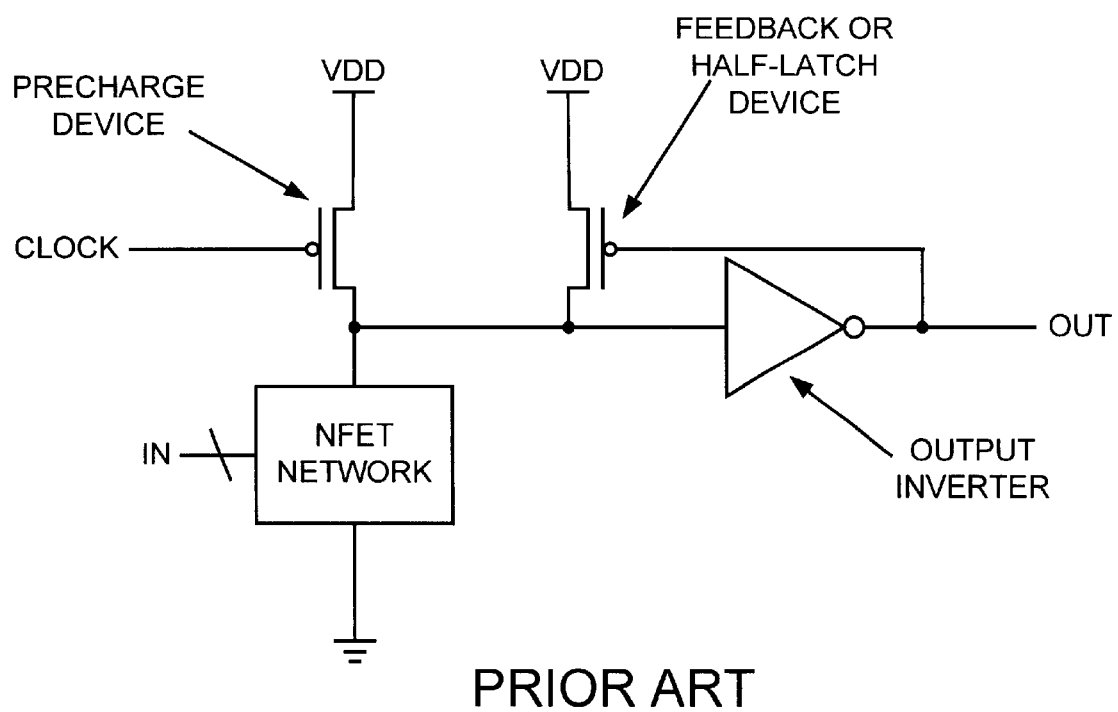
FIG. 1 is a schematic diagram illustrating the conventional type of dynamic circuit, an unfooted domino logic gate.
Figure 2:
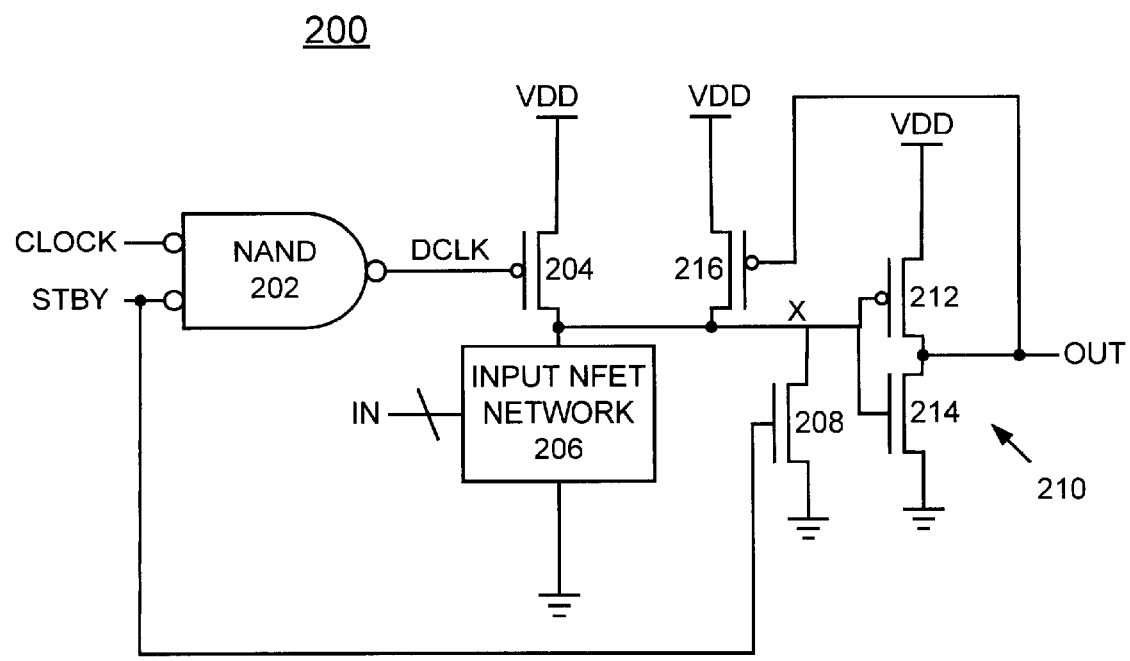
FIG. 2 is a schematic diagram illustrating an unfooted domino logic gate circuit in accordance with the preferred embodiment.

Having reference now to the drawings, in FIG. 2 there is shown an unfooted domino logic gate circuit generally designated by the reference character 200 in accordance with the preferred embodiment. In accordance with features of the preferred embodiments, both active and standby power dissipation in dynamic circuits are limited without significantly affecting the performance or area benefits of the domino logic gate circuit 200.

As shown in FIG. 2, domino logic gate circuit 200 includes a local standby control signal STBY that is inactive or low when a particular dynamic circuit is required to operate normally and is active or high when the dynamic circuit 200 is not needed and power dissipation is minimized. The standby control signal is asserted or active high for a standby mode of the domino circuit 200 and is unasserted or inactive low for an active mode of the domino circuit. A clock signal CLOCK synchronizes the precharge mode and the evaluation mode of all dynamic circuits in a given design. A gate NAND 202 combines STBY and CLOCK into a combined standby clock signal DCLK. The combined standby clock signal DCLK follows CLOCK when STBY is unasserted or inactive low. The combined standby clock signal DCLK is high when STBY is asserted or active high.

A precharge device, a P-channel field effect transistor (PFET) 204 is gated by DCLK to precharge an intermediate precharge node X each clock cycle when STBY is unasserted or inactive low. When STBY is high, the precharge PFET 204 is turned off. Precharge PFET 204 is either a higher threshold voltage (VT) PFET or has a design channel length (L) greater than the minimum allowed by the technology in order to minimize leakage current through the precharge PFET 204 when DCLK is high. PFET 204 with only a slightly higher VT or slightly longer channel length exhibits leakage current that is, for example, an order of magnitude or more below that of a transistor with lower VT or shorter design channel length (L) or LEFF. The source of the precharge PFET 204 is connected to a positive VOLTAGE supply rail VDD. The drain of the PFET 204 is connected to an intermediate precharge node X and an input NFET network 206. When STBY is low, the precharge PFET 204 is turned on with DCLK following CLOCK low clock cycles to precharge the intermediate precharge node X to a high or one level during the precharge mode. The precharge PFET 204 is turned off with DCLK following CLOCK high clock cycles during the evaluate mode.

A standby discharge device, an N-channel field effect transistor (NFET) 208 is connected between the intermediate precharge node X and ground having a gate receiving the local standby control signal STBY. NFET 208 is a small NFET device, such as a 1 micron, gated by STBY that serves to discharge the precharge node X to a known state (low) when STBY is high. A plurality of input signals is applied to the N-channel field effect transistor (NFET) network 206 that is connected to the intermediate precharge node X and an output inverter 210 that provides a logical output signal OUT responsive to the plurality of input signals. Output inverter 210 is formed by a series connected PFET 212 and NFET 214 connected between the positive voltage supply rail VDD and ground having a gate connected to the intermediate precharge node X and the NFET network 206. The NFET 214 forming half of the output inverter 210 of the domino gate circuit 200 is either a high VT NFET or has a design channel length (L) greater than the minimum allowed by the technology in order to minimize leakage current through this device when X is low. A feedback PFET 216 is connected between the voltage supply rail VDD and the intermediate node having a gate input connected to the output of the output inverter 210.

Whenever the local standby control signal STBY is unasserted or inactive low the dynamic circuit 200 performs normally as a domino circuit implementing a particular logic function defined by the topology of the input NFET network 206. Each cycle the DCLK following CLOCK can precharge node X to a high level and when CLOCK goes low node X conditionally discharges through the NFET network 206, causing the output OUT to go high. The critical delay through the domino gate circuit 200 is the sum of the falling delay of the precharge node X and the rising delay of the output OUT.

In accordance with feature of the preferred embodiment, none of the circuits in the critical path are changed, except for a small load on the precharge node X due to the drain capacitance of the added standby discharge NFET 208. The precharge path, which is the sum of the rising delay of the precharge node X and the falling output OUT, is much less critical in domino circuits in the case of footed domino gates.

When STBY goes high, regardless of the state of CLOCK, DCLK goes high turning off the precharge PFET 204. If the inputs IN are in a state as to create a series of on NFET devices through the NFET network, node X will immediately be discharged to ground. If the inputs do not cause this transition, then NFET 208 that is gated by STBY discharges intermediate precharge node X to ground. This is important because if intermediate precharge node X is allowed to float, that is, precharge PFET 204 is off and the inputs do not discharge X, then leakage and coupling can cause intermediate precharge node X to transition to some intermediate potential which would result in both PFET 212 and NFET 214 being on and current to flow between VDD and ground.

Since PFET 204 is either a long channel or high-VT transistor, very little leakage current can flow from VDD to ground and leakage current through the precharge portion of the domino circuit 200 is minimized. Also, since intermediate precharge node X has discharged to ground, PFET 212 is on and NFET 214 is off. Since NFET 214 is a long channel or high-VT transistor, very little leakage current can flow between VDD and ground in output inverter 210 of the domino circuit 200. The only leakage path in the domino circuit 200 that does not go through either a long LEFF or high VT device is through the feedback PFET 216. Since the feedback PFET 216 is not in a critical delay path, it may also be implemented as a high-VT or long LEFF transistor, but is normally very small anyway and would not contribute much leakage.

Since STBY active results in a high level on the outputs of all domino circuits in accordance with the preferred embodiment, the limited active and standby power dissipation in dynamic circuits of the preferred embodiment can be used in cases where the logic implemented by the domino circuits is not required for at least one clock cycle. This is a relatively common scenario, for example, as illustrated in FIG. 3.

Figure 3:
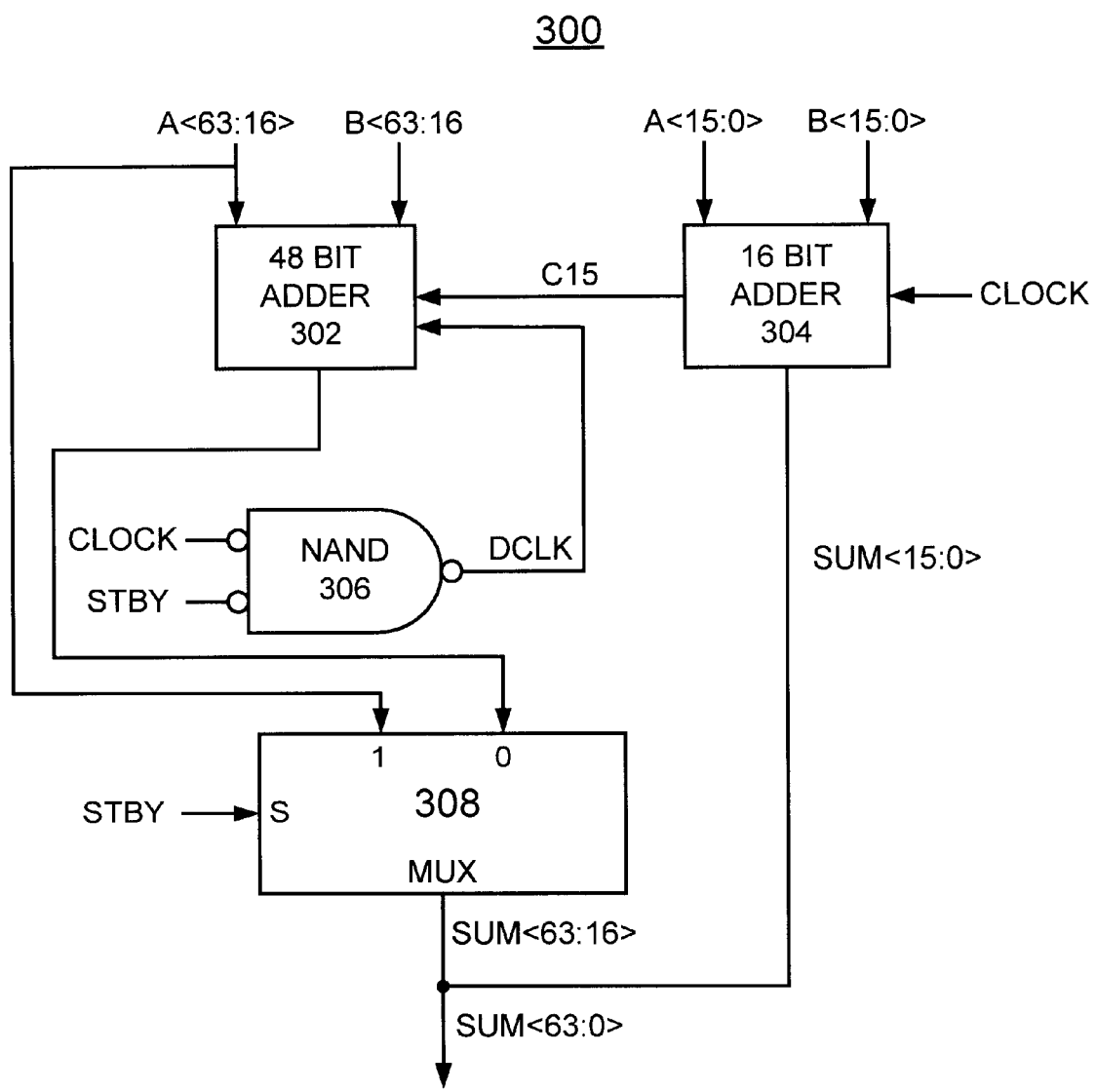
FIG. 3 is a schematic diagram illustrating an exemplary logic circuit in accordance with the preferred embodiment.

FIG. 3 illustrates an exemplary logic circuit generally designated by the reference character 300 in accordance with the preferred embodiment. In logic circuit 300, the logic is required to perform an addition of two 64-bit operands, A and B. However, it is a characteristic of the instruction set or architecture of this particular logic circuit 300 that most of the time one of the operands (B) is usually a quantity which uses 16 or fewer of the available 64 bits. For instance, add instructions using immediate operands of 10 bits or less typically significantly outnumber 64-bit additions. Therefore, it is wasteful to continually perform an addition of the higher order bits when the upper portion of one of the operands is most often zero.

This adder in this example has been divided into two portions, a 48-bit adder 302 that is implemented to minimize both active and standby power dissipation in accordance with the preferred embodiment and a 16-bit adder 304 that uses standard domino circuits. Logic circuit 300 includes a local standby control signal STBY that is inactive or low when 48-bit adder 302 is required to operate normally and is active or high when the 48-bit adder 302 is not needed so that power dissipation is minimized in the logic circuit 300. A gate NAND 306 combines STBY and CLOCK into a signal DCLK. The signal DCLK follows CLOCK when STBY is low but is high when STBY is high. When the signal DCLK goes high or is asserted, the precharge devices are turned off and any precharge nodes that were high are discharged in the 48-bit adder 302. This minimizes both active and standby power in the unused 48-bit adder 302 until STBY is unasserted, for example, many cycles later. The output of the 48-bit adder 304 is high during any cycle that STBY is asserted, the higher order bits of the nonzero (A) operated are forwarded through a multiplexer (MUX) 308 which is controlled by the standby control signal STBY, or logic including the standby control signal STBY as one of its factors, and is used as the higher order SUM bits.

In operation of the logic circuit 300, at least one cycle prior to the add, control logic must determine that the most common case, operand B is 16-bit or less and is unlikely to generate a carry C15, is indeed true. This could be accomplished by detecting all zeroes in the upper bits, or more likely by predicting that that will be the case for immediate operations. If the prediction is wrong, C15 is generated, then the instruction must be re-issued. If it is the case that the operand is small (<16-bit) and does not generate a carry upon the add, the control logic then asserts the standby control signal STBY high for the cycle in which the add is performed.

While the power savings for a single add instruction may not be balanced against the power dissipated by the switching required to detect and assert the standby condition. However, in the case of multi back-to-back instructions, which is the worst scenario for power dissipation and thermal heating, the additional power dissipated by the action required to detect and assert the standby condition is more than compensated by the power savings it provides in the 48-bit adder 302 of logic circuit 300.

Figure 4:
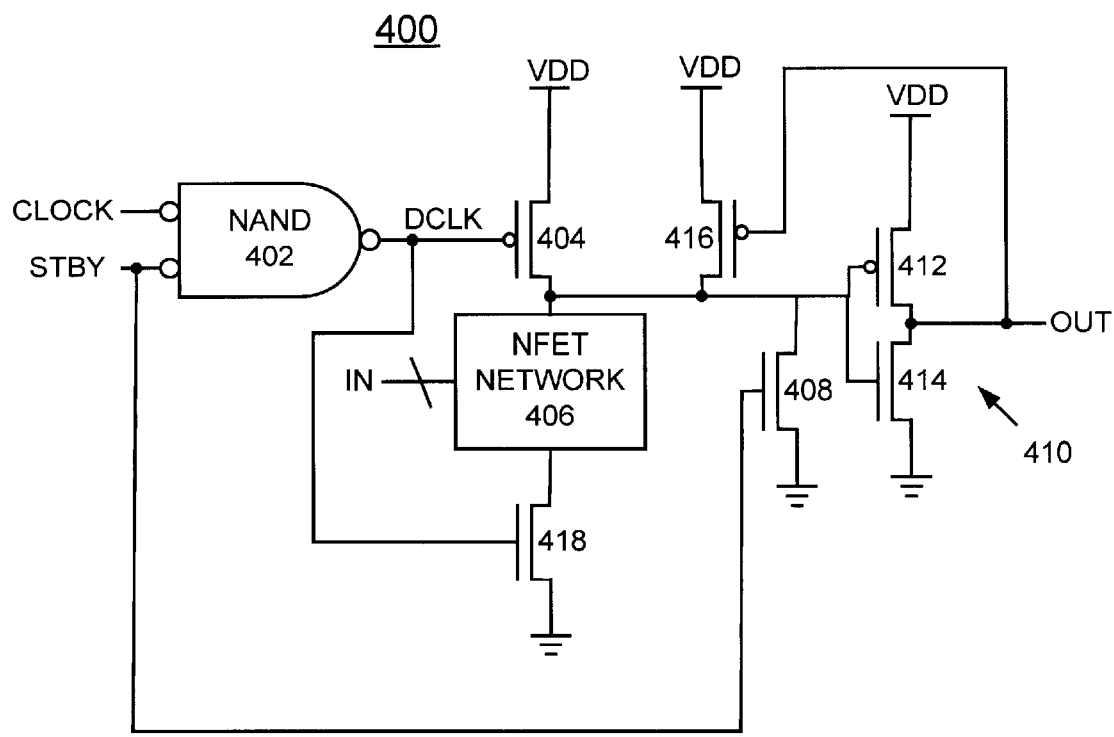
FIG. 4 is a schematic diagram illustrating a footed domino logic gate circuit in accordance with the preferred embodiment.

Referring now to FIG. 4, there is shown a footed domino logic gate circuit generally designated by the reference character 400 in accordance with the preferred embodiment. Both active and standby power dissipation in the domino logic gate circuit 400 are limited in accordance with the preferred embodiment. As shown in FIG. 4, domino logic gate circuit 400 includes the local standby control signal STBY that is inactive or low for normal operation of the domino logic gate circuit 400 and is active or high when the dynamic circuit 400 is not needed to minimize power dissipation. A gate NAND 402 combines STBY and CLOCK into a signal DCLK. The signal DCLK follows CLOCK when STBY is low and is high when STBY is high. A precharge PFET 404 is gated by DCLK to precharge an intermediate precharge node X. Precharge PFET 404 is either a high VT PFET or has a design channel length (L) greater than the minimum allowed by the technology in order to minimize leakage current through the precharge PFET 404 when DCLK is high. An input NFET network 406 is connected to the intermediate precharge node X. A standby discharge device, an N-channel field effect transistor (NFET) 408 is connected between the intermediate precharge node X and ground having a gate receiving the local signal STBY. NFET 408 is a small NFET device gated by STBY that serves to discharge the intermediate precharge node X to a known state (low) when STBY is high. An output inverter 410 provides a logical output signal OUT implementing a particular logic function defined by the topology of the input NFET network 406 responsive to the plurality of input signals. Output inverter 410 is formed by a series connected PFET 412 and NFET 414 connected between the positive voltage supply rail VDD and ground. PFET 412 and NFET 414 have a gate connected to the intermediate precharge node X and the NFET network 406. The NFET 414 of output inverter 410 is either a high VT NFET or has a design channel length (L) greater than the minimum allowed by the technology in order to minimize leakage current through the NFET 414 when the intermediate precharge node X is low. A feedback PFET 416 is connected between the voltage supply rail VDD and the intermediate node having a gate input connected to the output of the output inverter 410. An NFET 418 coupled between the NFET network 406 and ground is gated by DCLK. When STBY is high, the precharge PFET 404 is turned off and NFET 418 is turned on. When STBY is low, the precharge PFET 404 is turned on with DCLK following CLOCK low clock cycles to precharge the intermediate precharge node X to a high or one level during the precharge mode and NFET 418 is turned off decoupling a foot of the NFET network 406 from ground. The precharge PFET 404 is turned off and NFET 418 is turned on with DCLK following CLOCK high clock cycles during the evaluate mode.

While the present invention has been described with reference to the details of the embodiments of the invention shown in the drawing, these details are not intended to limit the scope of the invention as claimed in the appended claims.

What is claimed is:

1. Apparatus for controlling both active and standby power in a domino circuit comprising:
    a precharge device connected to an intermediate precharge node;
    an input transistor network receiving a plurality of data inputs connected to said intermediate precharge node;
    an output inverter connected to said intermediate precharge node; said output inverter including a pair of transistors; a predefined transistor of said pair of transistors being arranged to minimize leakage current through said output inverter;
    a standby control signal; said standby control signal being asserted for a standby mode of the domino circuit and being unasserted for an active mode of the domino circuit;
    a clock input;
    a gate for combining said standby control signal and said clock signal to provide a combined standby clock signal;
    said combined standby clock signal for controlling said precharge device; said precharge device being deactivated responsive to said standby control signal being asserted; said precharge device being arranged to minimize leakage current through said deactivated precharge device; and
    a standby discharge device connected to said intermediate precharge node and controlled by said standby control signal; said standby discharge device being activated to discharge said intermediate precharge node responsive to said standby control signal being asserted.

2. Apparatus for controlling both active and standby power in a domino circuit as recited in claim 1 wherein said precharge device includes a P-channel field effect transistor (PFET) and said PFET having a predefined high voltage threshold or a design channel length to minimize leakage current through said precharge PFET.

3. Apparatus for controlling both active and standby power in a domino circuit as recited in claim 1 wherein said pair of transistors of said output inverter include a P-channel field effect transistor (PFET) and a Nchannel field effect transistor (NFET).

4. Apparatus for controlling both active and standby power in a domino circuit as recited in claim 3 wherein said PFET and said NFET are connected in series between a supply voltage and ground and a gate of both said PFET and said NFET is connected to said intermediate precharge node.

5. Apparatus for controlling both active and standby power in a domino circuit as recited in claim 3 wherein said NFET of said output inverter has a predefined high voltage threshold or a design channel length to minimize leakage current through said of said output inverter.

6. Apparatus for controlling both active and standby power in a domino circuit as recited in claim 1 wherein said standby discharge device connected to said intermediate precharge node and controlled by said standby control signal includes an N-channel field effect transistor (NFET).

7. Apparatus for controlling both active and standby power in a domino circuit as recited in claim 6 wherein said standby discharge NFET includes a small NFET providing a discharge path between said intermediate precharge node and ground.

8. Apparatus for controlling both active and standby power in a domino circuit as recited in claim 1 further includes a footer device connected between said input transistor network and ground and wherein said combined standby clock signal controls said footer device.

9. Apparatus for controlling both active and standby power in a domino circuit as recited in claim 8 wherein said footer device includes an N-channel field effect transistor (NFET) and said footer NFET being activated responsive to said standby control signal being asserted.

10. Apparatus for controlling both active and standby power in domino circuit as recited in claim 1 wherein said gate for combining said standby control signal and said clock signal to provide a combined standby clock signal includes an NAND gate.

11. A domino logic gate circuit comprising:
    a standby control signal; said standby control signal being asserted for a standby mode of the domino logic gate circuit and being unasserted for an active mode of the domino logic gate circuit;
    a clock input;
    a NAND gate for combining said standby control signal and said clock signal to provide a combined standby clock signal;
    a precharge P-channel field effect transistor (PFET) connected between a positive voltage supply and an intermediate precharge node and having a gate receiving said combined standby clock signal; said precharge device being deactivated responsive to said standby control signal being asserted; said precharge PFET being arranged to minimize leakage current through said deactivated precharge PFET;
    an input transistor network receiving a plurality of data inputs and coupled between said intermediate precharge node and ground;
    an output inverter connected to said intermediate precharge node; said output inverter including a pair of transistors; a predefined transistor of said pair of transistors being arranged to minimize leakage current through said output inverter; and
    a standby discharge device connected between said intermediate precharge node and ground, said standby discharge device being controlled by said standby control signal; said standby discharge device being activated to discharge said intermediate precharge node responsive to said standby control signal being asserted.

12. A domino logic gate circuit as recited in claim 11 wherein said precharge P-channel field effect transistor (PFET) has a predefined high voltage threshold or a design channel length to minimize leakage current through said deactivated precharge PFET.

13. A domino logic gate circuit as recited in claim 11 wherein said pair of transistors of said output inverter include a P-channel field effect transistor (PFET) and a N-channel field effect transistor (NFET); said PFET and said NFET of said output inverter having a gate connected to said intermediate precharge node.

14. A domino logic gate circuit as recited in claim 13 wherein said NFET of said output inverter has a predefined high voltage threshold or a design channel length to minimize leakage current through said deactivated NFET of said output inverter.

15. A domino logic gate circuit as recited in claim 11 further includes a footer N-channel field effect transistor (NFET) connected between said input transistor network and ground and said footer NFET having a gate receiving said combined standby clock signal; footer NFET being activated responsive to said standby control signal being asserted.

16. A domino logic gate circuit as recited in claim 11 wherein said standby discharge device connected between said intermediate precharge node and ground includes an N-channel field effect transistor (NFET) having a gate receiving said standby control signal.

17. A method for controlling both active and standby power in domino circuits including a precharge device coupled to an intermediate precharge node; an input transistor network receiving a plurality of data inputs connected to said intermediate precharge node; and an output inverter connected to said intermediate precharge node; the output inverter including a P-channel field effect transistor (PFET) and a N-channel field effect transistor (NFET); the PFET and the NFET of the output inverter having a gate connected to the intermediate precharge node; said method comprising the steps of:

implementing the precharge device with a P-channel field effect transistor (PFET) having a predefined high voltage threshold or a design channel length to minimize leakage current through precharge PFET when deactivated;

implementing the NFET of the output inverter with an N-channel field effect transistor (NFET) having a predefined high voltage threshold or a design channel length to minimize leakage current through the output inverter;

providing a standby control signal; said standby control signal being asserted for a standby mode of the domino logic gate circuit and being unasserted for an active mode of the domino logic gate circuit;

combining said standby control signal and a clock signal to provide a combined standby clock signal;

gating the precharge PFET with said combined standby clock signal; the precharge PFET being deactivated responsive to said standby control signal being asserted;

connecting a standby discharge device between the intermediate precharge node and ground, and applying said standby control signal to said standby discharge device for discharging the intermediate precharge node responsive to said standby control signal being asserted.

18. A method for controlling both active and standby power in domino circuits as recited in claim 17 further includes the steps of connecting a footer device between the input transistor network and ground and applying said combined standby clock signal to said footer device.

19. A method for controlling both active and standby power in domino circuits as recited in claim 17 wherein the step of connecting said standby discharge device between the intermediate precharge node and ground includes the steps of connecting a small N-channel field effect transistor (NFET) between the intermediate precharge node and ground.

20. A method for controlling both active and standby power in domino circuits as recited in claim 17 wherein the step of combining said standby control signal and said clock signal to provide said combined standby clock signal includes the step of applying said standby control signal and said clock signal to a NAND gate to provide said combined standby clock signal.

* * * * *